United States Patent [19]
Takahashi et al.

[11] Patent Number: 5,530,270
[45] Date of Patent: Jun. 25, 1996

[54] SUBSTRATE FOR SEMICONDUCTR DEVICE

[75] Inventors: Yoshiharu Takahashi, Itami; Eitaro Nagai, Kawanishi, both of Japan

[73] Assignee: Mitsubishi Denki Kabushiki Kaisha, Tokyo, Japan

[21] Appl. No.: 799,247

[22] Filed: Nov. 27, 1991

[30]    Foreign Application Priority Data

Dec. 4, 1990 [JP] Japan .................................... 2-400350

[51] Int. Cl.⁶ ...................... H01L 29/74; H01L 31/111; H01L 23/62; H01L 27/11
[52] U.S. Cl. .................. 257/154; 257/358; 257/363; 257/379; 257/536; 257/904
[58] Field of Search ................ 357/51, 52, 53, 357/54, 57, 59, 71

[56]          References Cited

U.S. PATENT DOCUMENTS 4,288,829  9/1981  Tango ......................... 357/51

OTHER PUBLICATIONS

"Modular Resistor Array" IBM Technical Disclosure Bulletin vol. 13 No. 5 Oct. 1970 Bross et al.

*Primary Examiner*—Sara W. Crane
*Assistant Examiner*—Carl Whitehead, Jr.
*Attorney, Agent, or Firm*—Lowe, Price, LeBlanc & Becker

[57]           ABSTRACT

A semiconductor substrate includes a plurality of parallel resistor films connected between a pair of conductor strips. The resistor films and conductor strips are coated with a protective coat. The resistor films are cut one by one by laser trimming to adjust the total resistance value of the plurality of parallel resistor films. The protective coat on the uncut resistors remains unremoved.

6 Claims, 5 Drawing Sheets

SUBSTRATE FOR SEMICONDUCTR DEVICE

BACKGROUND OF THE INVENTION

1. Field of the Invention

The present invention relates to a substrate for a semiconductor device having a resistor film capable of adjusting a resistance value by laser trimming technique and the like and more particularly to an improvement in the resistor film.

2. Description of the Background Art

There is shown in FIGS. 9 and 10 a trimmed printed resistor portion for a conventional substrate for a hybrid integrated circuit. The substrate for the hybrid integrated circuit board includes a body 11 made of alumina. On the surface of the body 11, there are provided a pair of spaced strip-like conductor films 12A, 12B in parallel. A resistor film 13 is a thick-film resistor formed by printing and is substantially square in plan view. One side of the resistor film 13 is joined to the strip-like conductor film 12A, and the opposite side thereof is joined to the strip-like conductor film 12B. A protective coat 14, which is an overcoat glass, covers the pair of strip-like conductor films 12A, 12B and the resistor film 13.

In such a conventional structure, the resistance value R of the resistor film 13 is determined by $\rho \cdot \{l/(w \cdot t)\}$ where t, w, l and $\rho$ are the thickness, width, length and resistivity of the resistor film 13, respectively.

The resistor film 13 shown in FIGS. 9 and 10 is formed with an L-shaped trace 15 produced by the laser trimming technique. The trace 15 extends widthwise from a side end of the resistor film 13 and bends longitudinally at a predetermined position. In the conventional substrate for the semiconductor device, the resistance value of the resistor film 13 is desirably adjusted by forming the trace 15.

However, when the resistance value is adjusted by the laser trimming technique, not only the resistor film 13 but also the protective coat 14 for covering the resistor film 13 are removed. This causes the resistor film 13 to be exposed to an external atmosphere along the trace 15, as is apparent from FIG. 10. There arises a problem that the resistance value of the resistor film 13 is changed with time by moisture included in the external atmosphere.

It is not a customary practice to coat the resistor film exposed along the trace 15 again with the protective coat after the adjustment of the resistance value. If the resistor film is coated again with the protective coat, increase in the number of processes is accompanied by the rise in cost.

SUMMARY OF THE INVENTION

The present invention has been devised to solve the above-mentioned problems. Accordingly, an object of the present invention is to provide a substrate for a semiconductor device capable of preventing a resistance value from changing due to external factors after the adjustment of the resistance value by laser trimming technique.

To achieve the object, a circuit board for a semiconductor device according to the present invention comprises a body made of insulator; a pair of spaced strip-like conductor films provided in parallel on the body; a plurality of spaced resistor films arranged in parallel longitudinally of the strip-like conductor films, one end of each of the resistor films being joined to one of the strip-like conductor films, the other end of each of the resistor films being joined to the other strip-like conductor film; and a protective coat for covering the resistor films and the strip-like conductor films.

According to the substrate for the semiconductor device of the present invention, the plurality of resistor films are connected in parallel to the pair of strip-like conductor films. The resistor films are cut one by one, whereby the resistance value can be adjusted. By such one-by-one cutting of the resistor films, the protective coat for covering the resistor films which are cut is removed, while the protective coat for covering the resistor films which are not cut is left unremoved. This prevents the resistor films serving as a resistor from being exposed to the external atmosphere. Therefore, the quality of the resistor films is stabilized for long periods, and the resistance value is unchanged. The useless process for insulative coating after trimming can be eliminated.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
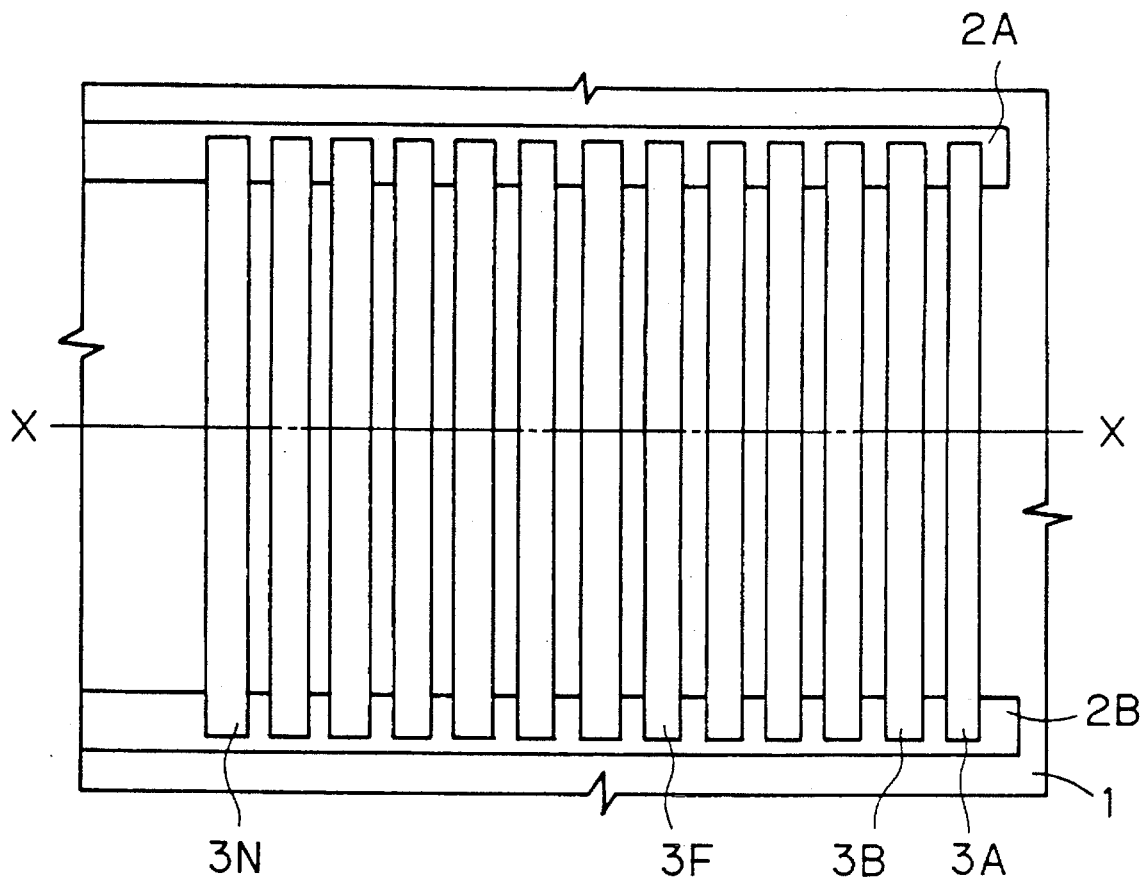
FIG. 1 is a plan view of a printed resistor portion of a circuit board for a semiconductor device according to a first preferred embodiment of the present invention.
Figure 2:
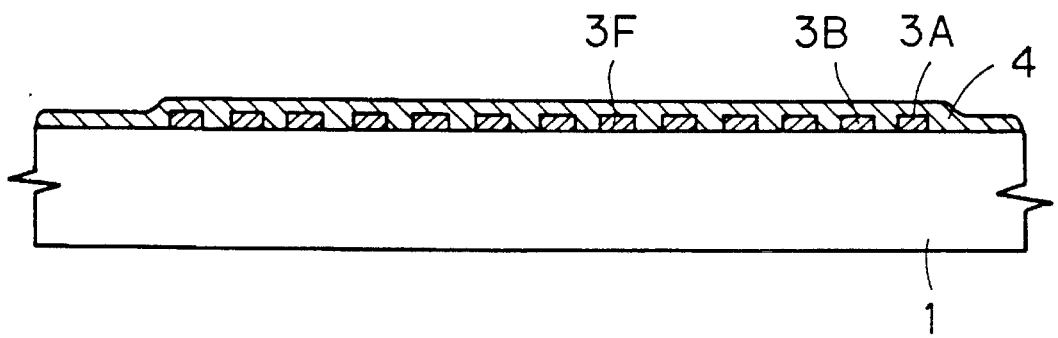
FIG. 2 is a cross-sectional view taken along the line X—X of FIG. 1

A substrate for hybrid integrated circuit of a first preferred embodiment shown in FIGS. 1 and 2 includes a body 1 made of insulator, such as alumina and so on.

A pair of spaced strip-like conductor films 2A, 2B are provided in parallel on the surface of the body 1.

Figure 7:
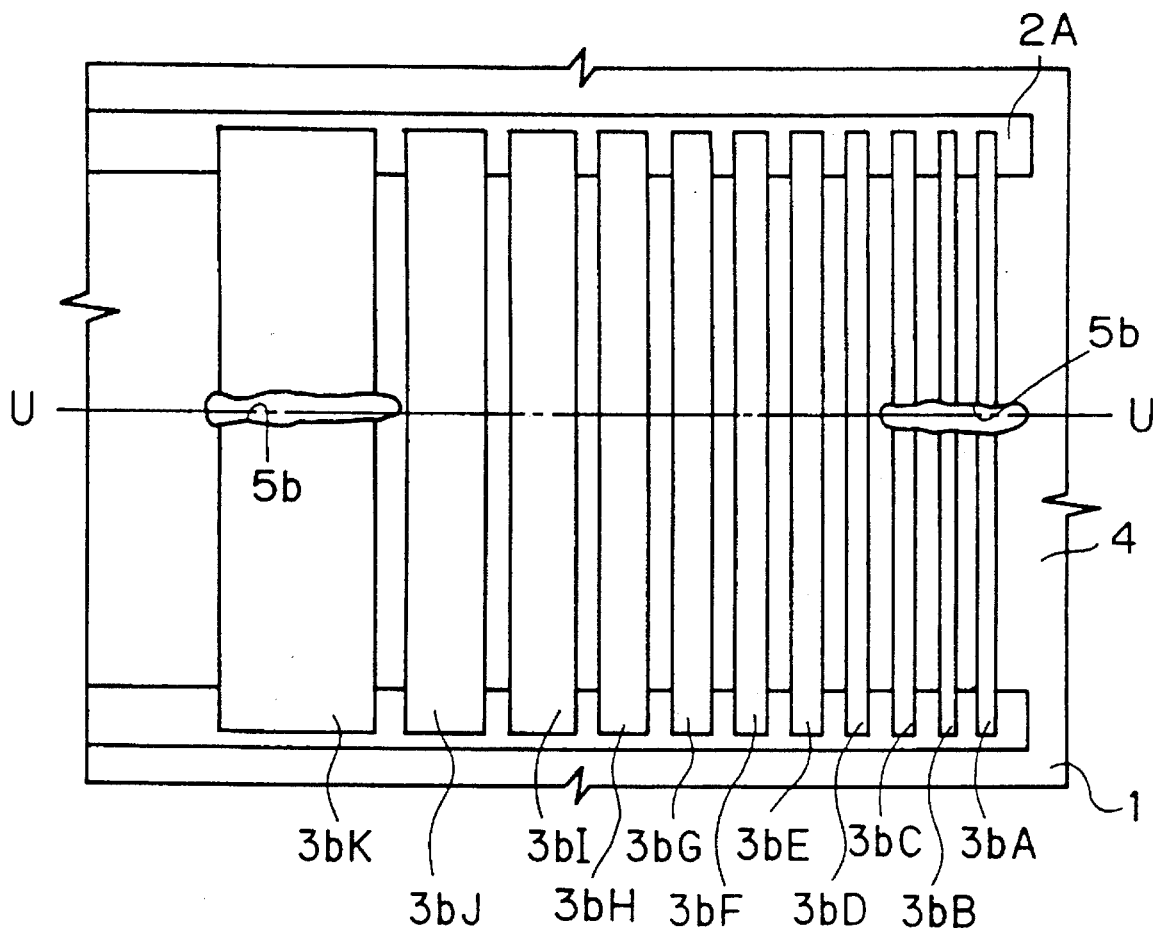
FIG. 7 is a plan view of the printed resistor portion of the circuit board for the semiconductor device according to a third preferred embodiment of the present invention.
Figure 8:
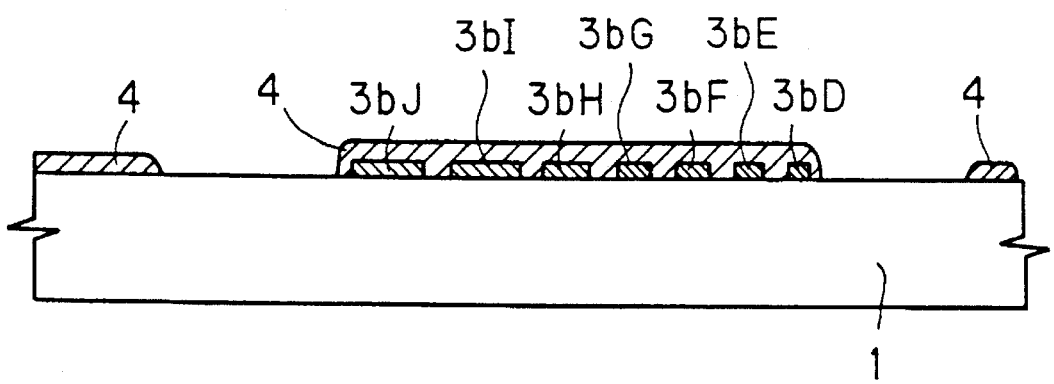
FIG. 8 is a cross-sectional view taken along the line U—U of FIG. 7.
Figure 9:
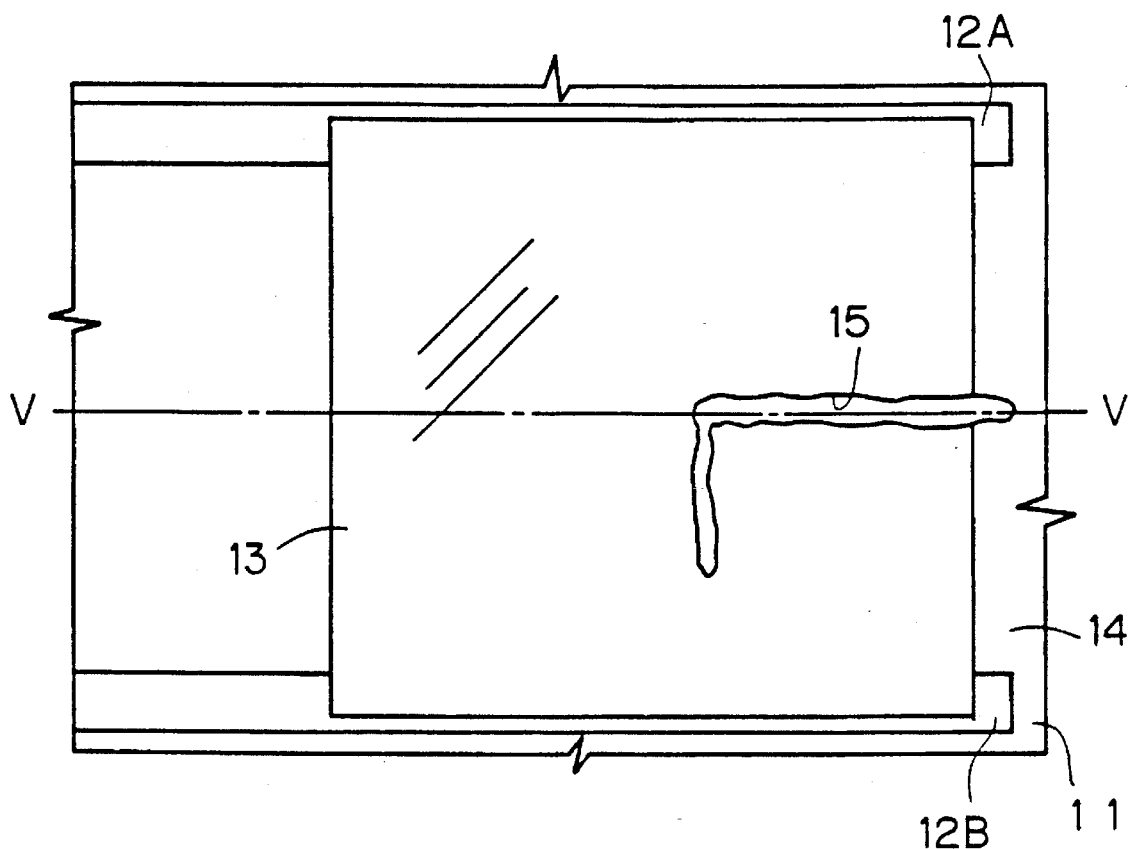
FIG. 9 is a plan view of a printed resistor portion of a conventional circuit board for a semiconductor device.
Figure 10:
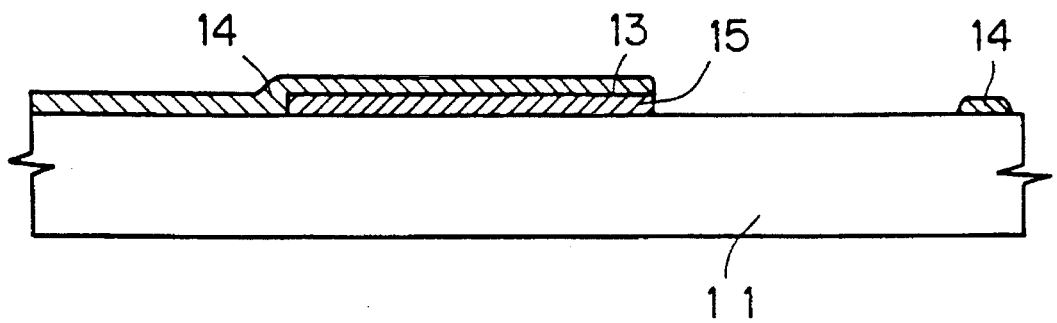
FIG. 10 is a cross-sectional view taken along the line V—V of FIG. 9.

A plurality of strip-like resistor films 3A to 3N are connected in parallel between the pair of strip-like conductor films 2A and 2B. Although the conventional substrate for the semiconductor device shown in FIGS. 7 and 8 has the single resistor film 13, the number of strip-like resistor films 3A to 3N is N in the substrate for the semiconductor device according to the first preferred embodiment. The plurality of resistor films 3A to 3N are arranged in parallel, longitudinally of and between the pair of strip-like conductor films 2A and 2B, in spaced apart relation to each other. One end of each of the resistor films 3A to 3N is joined to the strip-like conductor film 2A, while the other end thereof is joined to the strip-like conductor film 2B, in an overlapping manner.

The pair of strip-like conductor films 2A, 2B and the resistor films 3A to 3N are coated with a protective coat 4. The protective coat 4, which is an overcoat glass for the substrate for the hybrid integrated circuit, intervenes between the adjacent resistor films 3A to 3N, as shown in FIG. 2. That is, the top and side faces of the resistor films 3A to 3N are covered with the protective coat 4 separately.

Figure 3:
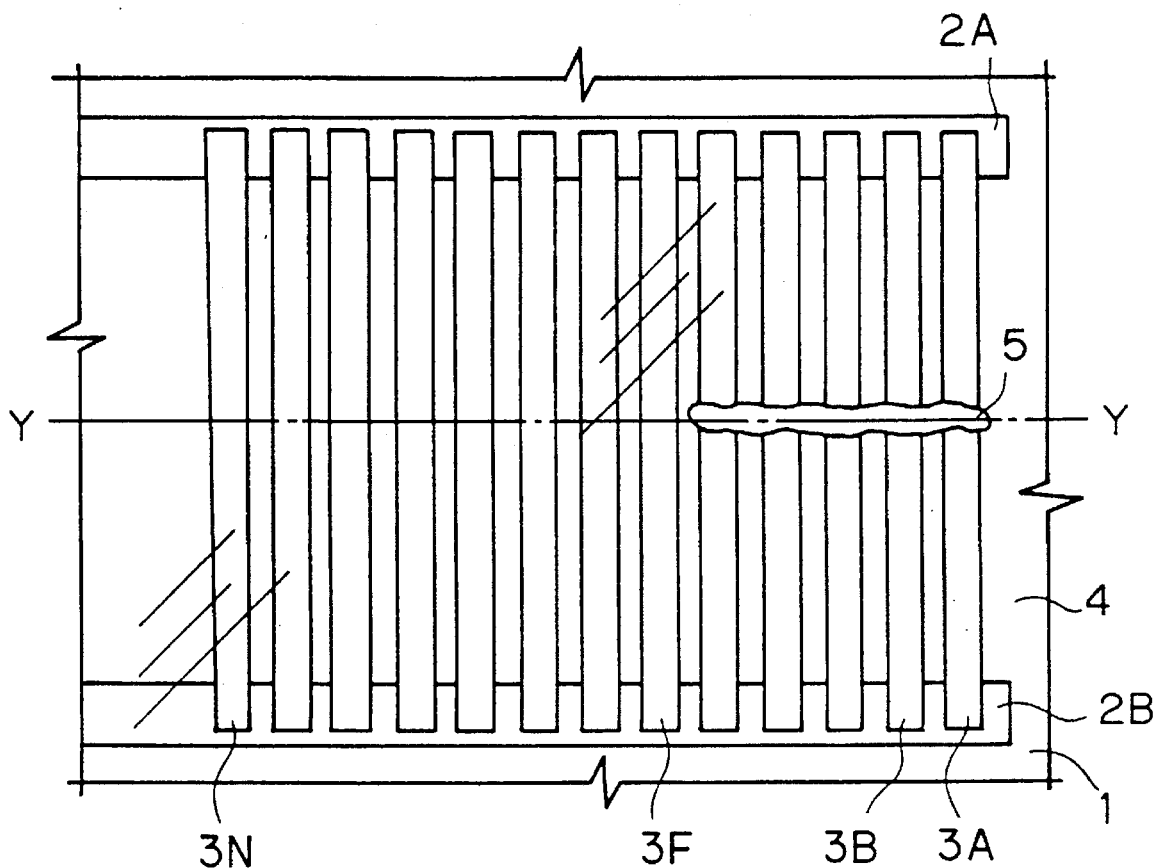
FIG. 3 is a plan view of the printed resistor portion of the circuit board for the semiconductor device of FIG. 1 after the adjustment of the resistance value of a resistor film.
Figure 4:
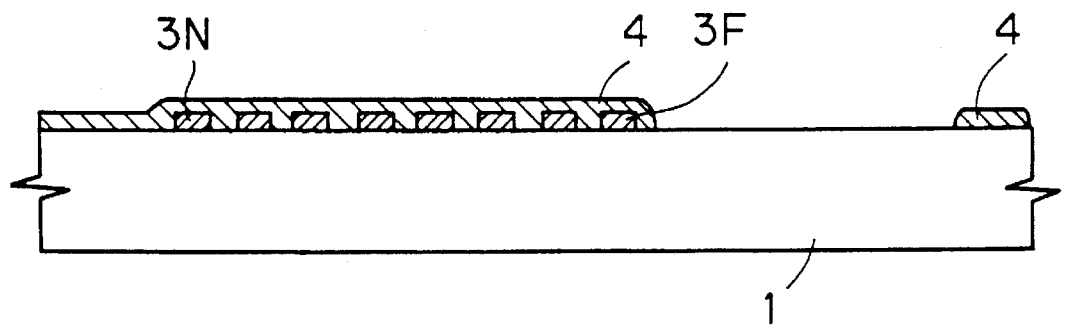
FIG. 4 is a cross-sectional view taken along the line Y—Y of FIG. 3.
Figure 5:
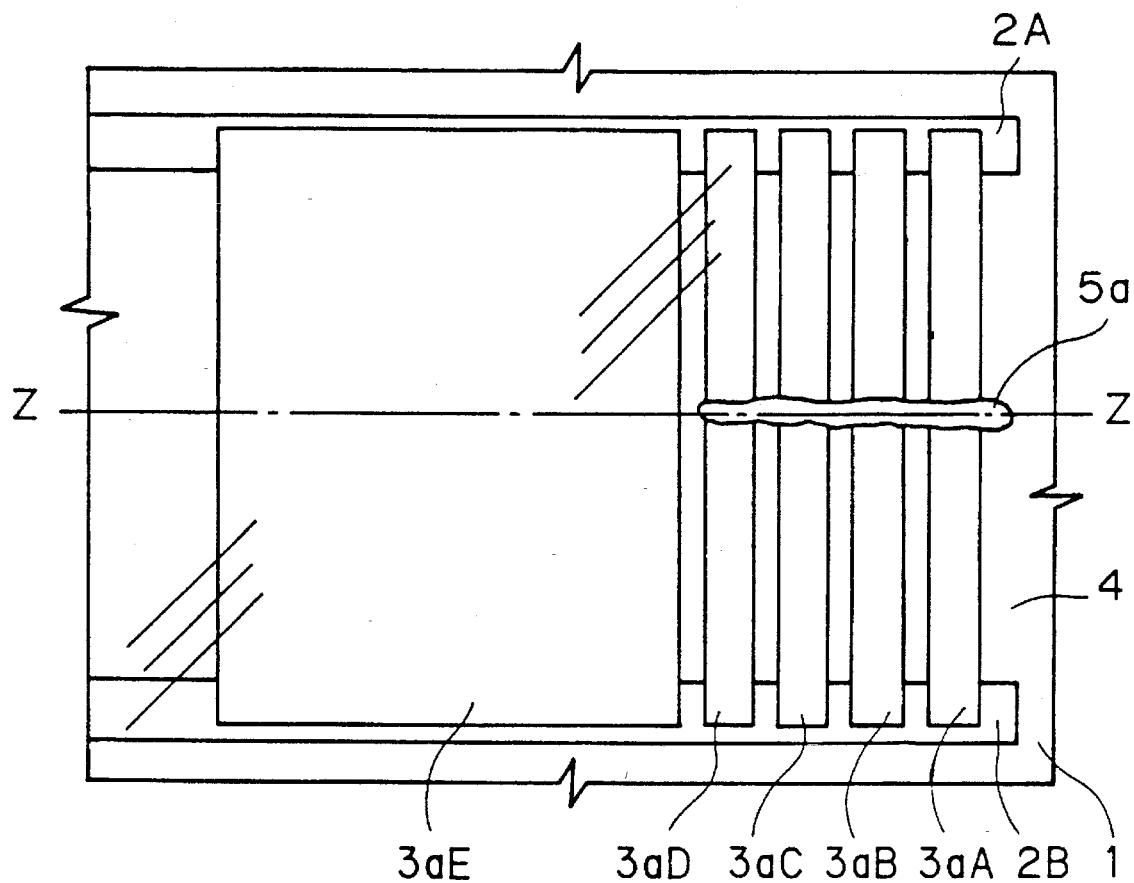
FIG. 5 is a plan view of the printed resistor portion of the circuit board for the semiconductor device according to a second preferred embodiment of the present invention.
Figure 6:
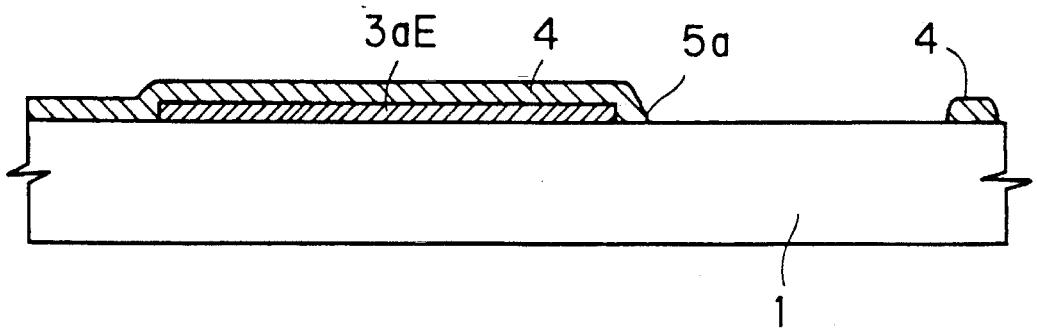
FIG. 6 is a cross-sectional view taken along the line Z—Z of FIG. 5.

For the adjustment of a resistance value in the first preferred embodiment, some of the resistance films 3A to 3N which are desired should be cut by means of the laser trimming technique or the like, as shown in FIGS. 3 and 4. In this case, only a target resistor film is sure to be cut while the remaining resistor films are left coated with the protective coat 4. Cutting of the plurality of desired resistor films in sequential order from the extreme left or right of FIGS. 1 and 2 will facilitate the trimming operation.

In the first preferred embodiment, the resistance values $R_1$ to $R_n$ of the resistor films 3A to 3N are determined respectively by $\rho \cdot \{l/(w/n) \cdot t\}$ where n is the number of resistor films 3A to 3N, and t, w/n, l and $\rho$ are the thickness, width, length and resistivity of each of the resistor films 3A to 3N. The total resistance value R is determined by the number of resistor films remaining uncut.

Assuming that the number of resistor films is ten, cutting of one resistor film will increase the total resistance value R substantially by 10. Assuming that the number of resistor films is twenty, cutting of one resistor film will increase the total resistance value R substantially by 5%. The setting of the number of resistor films to be cut enables the resistance value to be adjusted bit by bit.

Although the resistor films 3A to 3N have the same length l, the same width w and the same thickness t in the first preferred embodiment, the present invention is not limited to this. For example, different widths w or different thicknesses t may be set to the resistor films. In a second preferred embodiment shown in FIGS. 5 and 6, a wide resistor film 3aE and a plurality of narrow resistor films 3aA to 3aD are employed in combination. The narrow resistor films 3aA to 3aD and the wide resistor film 3aE have the same length l and the same thickness t. In a third preferred embodiment shown in FIGS. 7 and 8, a plurality of resistor films 3bA to 3bK are employed in combination. The resistor films 3bA to 3bK have the same thickness, the same length and the widths decreasing gradually at a predetermined ratio. The resistor films 3bA to 3bK of FIGS. 7 and 8 can achieve a high-accuracy adjustment of the resistance value, in which the wider resistor films are cut first for a rough adjustment and the narrower resistor films are cut subsequently for a fine adjustment. Thus, the widths as well as the thicknesses of the resistor films need not be uniform. Since the parts other than the resistor films in FIGS. 5 to 8 are similar to those in FIGS. 1 and 2, the same reference numerals or characters are assigned to the corresponding parts and the description thereof is omitted. FIGS. 5 to 8 illustrates the printed resistor portions on which the trimming has been executed, that is, on which the trace 5a or 5b is formed.

The printed resistor of the substrate for the hybrid integrated circuit is discussed in the aforesaid preferred embodiments. However, the present invention is not limited to this. A resistor chip is also applicable.

While the invention has been shown and described in detail, the foregoing description is in all aspects illustrative and not restrictive. It is therefore understood that numerous modifications and variations can be devised without departing from the scope of the invention.

What is claimed is:

1. A substrate for a semiconductor device comprising:

an insulator body;

a pair of spaced strip-like conductor films provided in parallel on said body;

a plurality of spaced resistor films arranged in parallel longitudinally of said strip-like conductor films, one end of each of said resistor films being joined to one of said strip-like conductor film and the other end of each of said resistor fill being joined to the other strip-like conductor film, defining length l;

said resistor films including at least one resistor film cut all the way through at an approximate midpoint of the length l of the resistor film to adjust the total resistance of the plurality of spaced resistor films; and a protective coat for covering said resistor films and said strip-like conductor films, wherein said resistor films have two or more resistant values.

2. A substrate for a semiconductor device in accordance with claim 1, wherein said resistor films of different resistance values have the same length, the same thickness and different widths.

3. A substrate for a semiconductor device in accordance with claim 2, wherein said plurality of resistor films have two or more widths changing gradually at a predetermined ratio.

4. A substrate for a semiconductor device in accordance with claim 3, wherein said resistor films are arranged in the order of descending width.

5. A substrate for a semiconductor device in accordance with claim 2, wherein said plurality of resistor films have two widths, one of said plurality of resistor films having one of said two widths and the remaining ones of said resistor films having the other width.

6. A substrate for a semiconductor device comprising:

an insulator body;

a pair of spaced strip-like conductor films provided in parallel on said body;

a plurality of spaced resistor films arranged in parallel longitudinally of said strip-like conductor films, one end of each of said resistor films being joined to one of said strip-like conductor film and the other end of each of said resistor films being joined to the other strip-like conductor film, defining a length l;

said resistor films including at least one resistor film cut all the way through at an approximate midpoint of the length l of the resistor film to adjust the total resistance of the plurality of spaced resistor films;

a protective coat for covering said resistor films and said strip-like conductor films;

and further comprising a plurality of immediately adjacent ones of said resistor films each bisected by cutting at an approximate midpoint of the length of the resistor films.

* * * * *